United States Patent
Li et al.

(10) Patent No.: US 11,005,423 B2
(45) Date of Patent: May 11, 2021

(54) BIAS CIRCUIT AND POWER AMPLIFICATION CIRCUIT

(71) Applicant: SMARTER MICROELECTRONICS (SHANGHAI) CO., LTD., Shanghai (CN)

(72) Inventors: Yongle Li, Shanghai (CN); Qiang Su, Shanghai (CN); Baiming Xu, Shanghai (CN)

(73) Assignee: SMARTER MICROELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/666,329

(22) Filed: Oct. 28, 2019

(65) Prior Publication Data

US 2020/0067456 A1    Feb. 27, 2020

Related U.S. Application Data

(63) Continuation of application No. PCT/CN2017/112171, filed on Nov. 21, 2017.

(30) Foreign Application Priority Data

Jul. 24, 2017   (CN) .......................... 201710606552.0

(51) Int. Cl.
| | |
|---|---|
| *H03F 3/04* | (2006.01) |
| *H03F 1/02* | (2006.01) |
| *H03F 3/21* | (2006.01) |
| *H03K 17/60* | (2006.01) |
| *H03F 1/30* | (2006.01) |

(52) U.S. Cl.
CPC .......... *H03F 1/0205* (2013.01); *H03F 1/301* (2013.01); *H03F 1/302* (2013.01); *H03F 3/21* (2013.01); *H03K 17/60* (2013.01)

(58) Field of Classification Search
CPC .... H03F 1/0205; H03F 3/21; H03F 2200/111; H03F 1/0261; H03F 3/245; H03F 2200/451; H03F 1/32; H03F 1/56; H03F 3/19; H03F 1/0216; H03K 17/60
USPC ................... 330/296, 285, 296.51
See application file for complete search history.

(56) References Cited

U.S. PATENT DOCUMENTS

2016/0094189 A1*  3/2016  Lyalin .................... H03F 3/211
                                                             330/296

* cited by examiner

*Primary Examiner* — Khanh V Nguyen
*Assistant Examiner* — Khiem D Nguyen
(74) *Attorney, Agent, or Firm* — Syncoda LLC; Feng Ma

(57) ABSTRACT

A bias circuit includes a first branch circuit, a second branch circuit, a current amplifier and a switch, wherein the first branch circuit is configured to shunt an inputted first current, and input a first branch current of the first current to a power supply ground; the second branch circuit is configured to shunt the inputted first current, and input a second branch current of the first current to the current amplifier; the current amplifier is configured to receive the second branch current of the first current and amplify the second branch current of the first current to serve as a bias current of a power amplifier connected to the bias circuit for outputting; and the switch is configured to switch different resistance values for a resistor in the first branch circuit and/or switch different resistance values for a resistor in the second branch circuit.

8 Claims, 3 Drawing Sheets

BIAS CIRCUIT AND POWER AMPLIFICATION CIRCUIT

CROSS-REFERENCE TO RELATED APPLICATIONS

This is a continuation of International Application No. PCT/CN2017/112171 filed on Nov. 21, 2017, which claims priority to Chinese Patent Application No. 201710606552.0 filed on Jul. 24, 2017. The disclosures of these applications are hereby incorporated by reference in their entirety.

BACKGROUND

When a radio frequency signal in the 2nd Generation (2G), The 3rd Generation (3G) or the 4th Generation (4G) mobile communication technology is amplified by a multi-mode multiband radio frequency power amplifier, the power amplifier should operate in different states. The power amplifier that operates in a 2G mode should be provided with a large bias current such that the power amplifier operates in a class A mode of power amplifier, thereby further realizing better output power and linearity. The power amplifier that operates in a 3G or 4G mode should be provided with a small bias current such that the power amplifier operates in a class A and class B mode of power amplifier, thereby further realizing better efficiency and linearity compatibility. That is to say, the power amplifier compatible with different modes such as the 2G mode, the 3G mode and the 4G mode has different bias currents for realizing an optimal performance in each of different modes such as the 2G mode, the 3G mode and the 4G mode.

As shown in FIG. 1, in related technologies, a fixed bias circuit is generally used to provide the power amplifier compatible with the different modes such as the 2G mode, the 3G mode and the 4G mode with a base bias current. The fixed bias circuit is fixed to a radio frequency impedance of a base of the power amplifier, such that a base current provided for the power amplifier is fixed.

SUMMARY

The present disclosure relates to the field of electronic technologies, and in particular to a bias circuit and a power amplification circuit.

In view of this, a bias circuit and a power amplification circuit are provided in embodiments of the present disclosure.

A bias circuit is provided in the embodiment of the present disclosure, which includes: a first branch circuit, a second branch circuit, a current amplifier and a switch.

The first branch is configured to shunt an inputted first current and input a first branch current of the first current to power supply ground.

The second branch is configured to shunt the inputted first current and input a second branch current of the first current to the current amplifier.

The current amplifier is configured to receive the second branch current, amplify the second branch current, and output the amplified second branch current as a bias current of a power amplifier connected to the bias circuit.

The switch is configured to switch different resistance values for a resistor in the first branch circuit, and/or switch different resistance values for a resistor in the second branch circuit.

In the above technical solution, the current amplifier includes a transistor. A collector of the transistor is connected to a positive electrode of a direct current (DC) power supply. The transistor is configured to amplify the received second branch current and output the amplified second branch current as the bias current of the power amplifier connected to the bias circuit.

In the above technical solution, the first branch circuit includes a first resistor.

The switch is connected in parallel with the first resistor, or the second branch circuit includes a second resistor, and the switch is connected in parallel with the second resistor.

In the above technical solution, the first branch circuit includes a first resistor, and the second branch circuit includes a second resistor.

The switch includes a first sub-switch and a second sub-switch. The first sub-switch is connected in parallel with the first resistor and the second sub-switch is connected in parallel with the second resistor.

In the above technical solution, an emitter of the transistor is connected to a base of the power amplifier of the power amplification circuit via a third resistor.

In the above technical solution, the first branch circuit includes at least one diode connected in series along a forward direction of the first branch current.

In the above technical solution, the switch is a Heterojunction Bipolar Transistor (HBT), a Metal Oxide Semiconductor Field Effect Transistor (MOSFET), or a High Electron Mobility Transistor (HEMT).

In the above technical solution, a shunt point where the first branch circuit is connected to the second branch circuit is connected to the power supply ground via a first capacitor.

In the above technical solution, the diode is connected between the first resistor and the power supply ground, or the first resistor is connected between the diode and the power supply ground.

A power amplification circuit is further provided in the embodiment of the present disclosure. The power amplification circuit includes a power amplifier and the bias circuit provided in the above technical solutions.

The bias circuit is connected to the power amplifier and configured to input a bias current to the power amplifier.

The power amplifier is configured to amplify, based on the bias current, an inputted radio frequency signal correspondingly and output the amplified radio frequency signal.

A bias circuit and a power amplification circuit are provided in the embodiments of the present disclosure. The bias circuit includes: a current amplifier, a switch, a first branch circuit and a second branch circuit, where each of the first branch circuit and the second branch circuit is configured to shunt an inputted first current. The current amplifier receives a second branch current of a first current, amplifies the second branch current, and outputs the amplified second branch current as a bias current of a power amplifier connected to the bias circuit. The switch switches different resistance values for a resistor in the first branch circuit or the second branch circuit. With the above technical solution, switching-on and switching-off of the switch can change a resistance value of the resistor in the first branch circuit or a resistance value of the resistor in the second branch circuit, thereby changing a radio frequency impedance of the bias circuit with respect to a base of the power amplifier, changing a bias current provided by the bias circuit to the power amplifier, and improving a performance of the power amplification circuit.

DETAILED DESCRIPTION

Figure 1:
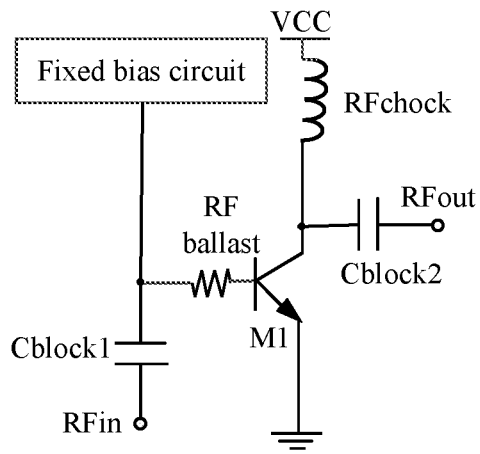
FIG. 1 illustrates a schematic circuit diagram of a power amplification circuit according to related technologies.

The power amplifier illustrated in FIG. 1, which is compatible with the different modes such as the 2G mode, the 3G mode and the 4G mode, can only realize the optimal performance in one mode.

In the embodiment of the present disclosure, a bias circuit includes a first branch circuit, a second branch circuit, a current amplifier and a switch. The first branch is configured to shunt an inputted first current and input a first branch current of the first current to power supply ground. The second branch is configured to shunt the inputted first current and input a second branch current of the first current to the current amplifier. The current amplifier is configured to receive the second branch current of the first current, amplify the second branch current of the first current, and output the amplified second branch current as a bias current of a power amplifier connected to the bias circuit. The switch is configured to switch different resistance values for a resistor in the first branch, and/or switch different resistance values for a resistor in the second branch.

In this way, when the switch is in different states of switching-on and switching-off, resistance values of the first branch circuit or second branch circuit are different, the radio frequency impedances of the bias circuit with respect to a base of the power amplifier are different, and bias currents provided by the bias circuit to the power amplifier are different, thus effectively and flexibly realizing control of the bias current of the power amplifier, such that the power amplifier compatible with different modes, such as the 2G mode, the 3G mode and the 4G mode, realizes an optimal performance in each of the different modes such as the 2G mode, the 3G mode and the 4G mode.

In addition, the bias circuit provided in the embodiment of the present disclosure may be adopted such that the radio frequency signal has different impedances at the base. In case of broadband modulation signals of 3G and 4G, when the impedance of the modulation signal of the bias circuit is small, it is conducive to reducing a memory effect of the circuit, such that an optional radio frequency performance may be realized under different mode states.

In order to understand characteristics and technical contents of the present disclosure in more detail, implementation of the present disclosure is described in detail in conjunction with the attached drawings below. The attached drawings are for reference only and are not intended to limit the present disclosure.

First Embodiment

Figure 2:
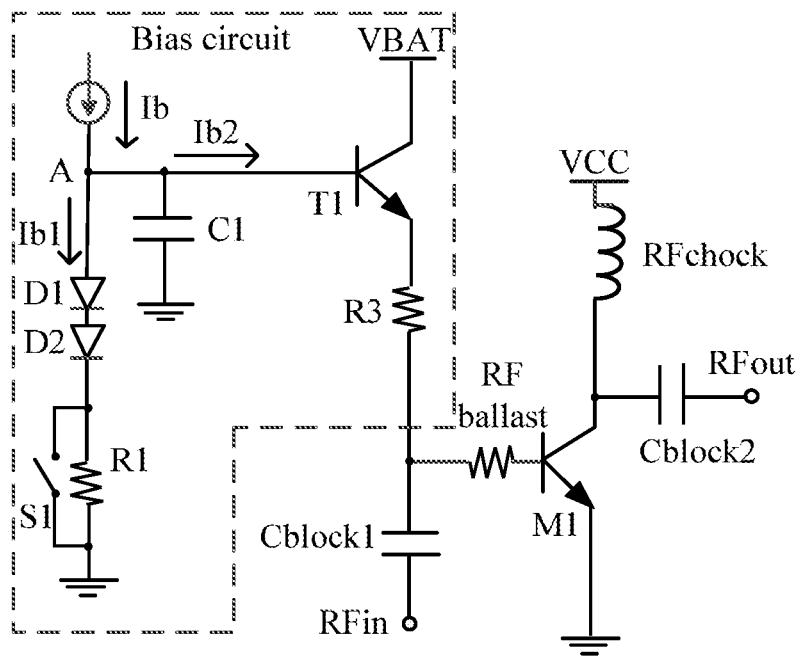
FIG. 2 illustrates a schematic circuit diagram of a power amplification circuit according to a first embodiment of the present disclosure.

FIG. 2 is a schematic circuit diagram of a bias circuit according to an embodiment of the present disclosure. As shown in FIG. 2, a first branch circuit and a second branch circuit in the bias circuit provided in the embodiment of the present disclosure are connected at a shunt point A. The first branch circuit and the second branch circuit shunts a current Ib provided by a current source into a first branch current Ib1 and a second branch current Ib2. The shunt point A where the first branch circuit and the second branch circuit are connected is connected to power supply ground via a first capacitor C1 that is configured to provide radio frequency reference ground for an input bias.

The first branch circuit includes two diodes D1 and D2 that connected in series along a forward direction of the first branch current Ib1 and a first resistor R1 that connected between the diodes D1 and D2 and the power supply ground. The first branch current Ib1 is inputted to the power supply ground via the first branch circuit. The first resistor R1 is connected in parallel with a switch S1. The switch S1 can be implemented with a power device such as an HBT, a MOSFET or an HEMT.

The second branch current Ib2 is inputted to a base of a transistor T1 having a function of current amplification via the second branch circuit. A collector of the transistor T1 is connected to a positive electrode of a DC power supply VBAT. The transistor T1 is configured to amplify the second branch current Ib2 received by the base of the transistor T1, and output the amplified second branch current as a bias current of a power amplifier M1 connected to the bias circuit from an emitter of the transistor T1.

As shown in FIG. 2, the emitter of the transistor is connected to a base of the power amplifier of the power amplification circuit via a third resistor R3.

In the bias circuit provided by the embodiment of the present disclosure, the current Ib provided by a current source is shunted into the first branch current Ib1 and the second branch current Ib2 at the shunt point A. The second branch current Ib2 is amplified to Ib2*β1 by the transistor T1 and then outputted to the base of the power amplifier M1 via a radio frequency resistor RFballast such that a base bias current Ibase=Ib2*β1 is provided for the power amplifier M1. In a case where a parameter of the transistor T1, a parameter of the diode D1 and a parameter of the diode D2 are fixed, a ratio of the first branch current Ib1 to the second branch current Ib2 obtained after shunting at the shunt point A is determined based on the resistor R1, the resistor R3 and the resistor RFballast. As a resistance of the resistor R1 becomes smaller, a resistance of the resistor R3 or a resistance of the resistor RFballast becomes larger, the first branch current Ib1 becomes larger, and the second branch current Ib2 becomes smaller. As the resistance of the resistor R1 becomes larger, the resistance of the resistor R3 or the resistance of the resistor RFballast becomes smaller, the first branch current Ib1 becomes smaller, and the second branch current Ib2 becomes larger.

By switching the switch S1, the resistance value of the resistor R1 may be changed, and the second branch current Ib2 is further changed, so as to control a bias current of the power amplifier M1. Specifically, in a case where the parameter of the resistor R3 and the parameter of the resistor RFballast are both fixed, when the switch S1 is switched-off, the resistance value of the first branch circuit is R1, and the second branch current Ib2 reaches a maximum, which can provide the power amplifier in the 2G mode with the bias current. When the switch S1 is switched-on, the resistance value of the first branch circuit is 0, and the second branch current Ib2 reaches a minimum, which can provide the power amplifiers in the 3G and 4G modes with the bias current.

In addition, in a case where the switch S1 is switched-off and switched-on, the shunt point A may have different impedances, such that a radio frequency signal has different impedances at the base in the different modes. In case of broadband modulation signals of 3G and 4G, an impedance of the modulation signal of the bias circuit is low, which is conducive to reducing a memory effect of the circuit.

A bias circuit is provided in the embodiment of the present disclosure. The bias circuit includes: a current amplifier, a switch, a first branch circuit and a second branch circuit, where each of the first branch circuit and the second branch circuit is configured to shunt an inputted first current. The current amplifier receives a second branch current of the first current, amplify the second branch current, and output the amplified second branch current as a bias current of a power amplifier connected to the bias circuit. The switch switches different resistance values for a resistor in the first branch circuit or the second branch circuit. With the above technical solution, switching-off and switching-on of the switch can change the resistance value of the resistor in the first branch circuit or the resistance value of the resistor in the second branch circuit, thereby changing a radio frequency impedance of the bias circuit with respect to a base of the power amplifier, and changing a bias current provided to the power amplifier from the bias circuit, such that the power amplifier compatible with the different modes, such as the 2G mode, the 3G mode and the 4G mode, can be provided with the different bias currents, thus improving the performance of the power amplification circuit.

Second Embodiment

Figure 3:
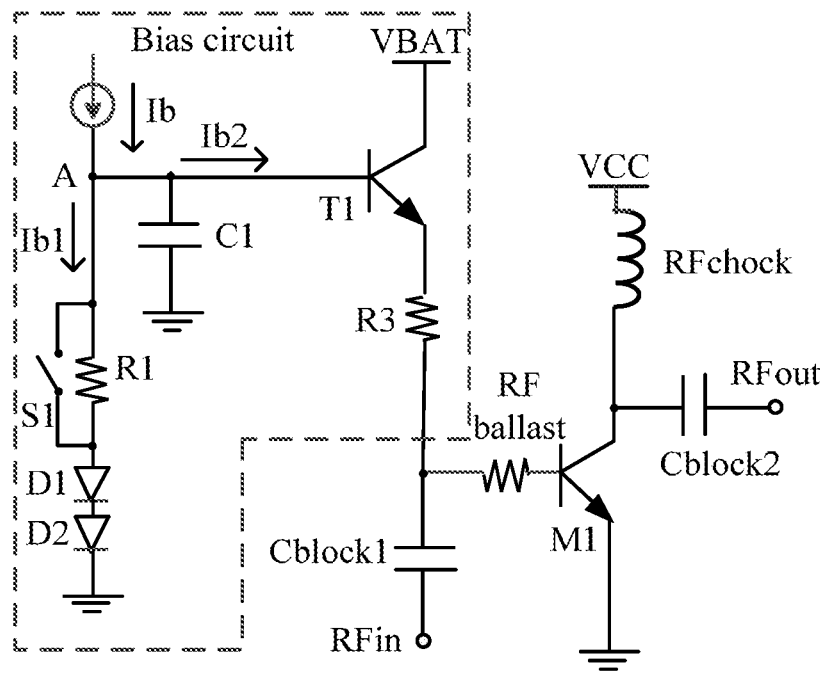
FIG. 3 illustrates a schematic circuit diagram of a power amplification circuit according to a second embodiment of the present disclosure.

The embodiment of the present disclosure is similar to the first embodiment, except that, as shown in FIG. 3, the diodes D1 and D2 are connected between the first resistor R1 and the power supply ground.

Identical to the first embodiment, the bias circuit provided in the embodiment of the present disclosure may provide a power amplifier compatible with the different modes, such as the 2G mode, the 3G mode and the 4G mode, with different bias currents, thus improving the performance of the power amplification circuit.

Third Embodiment

Figure 4:
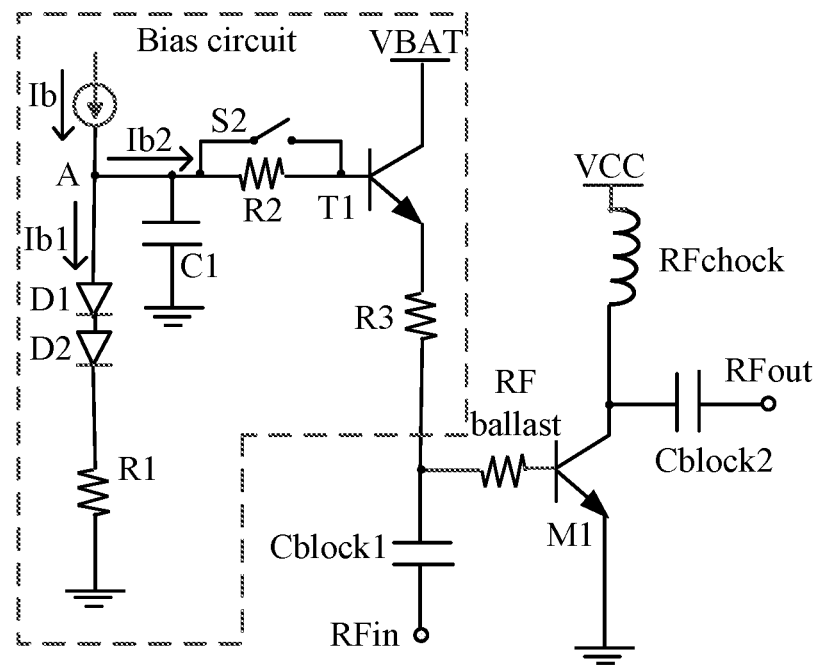
FIG. 4 illustrates a schematic circuit diagram of a power amplification circuit according to a third embodiment of the present disclosure.

FIG. 4 is a schematic circuit diagram of a bias circuit according to the embodiment of the present disclosure. As shown in FIG. 4, a first branch circuit and a second branch circuit in the bias circuit provided in the embodiment of the present disclosure are connected at a shunt point A. The first branch circuit and the second branch circuit shunt a current Ib provided by a current source into a first branch current Ib1 and a second branch current Ib2. The shunt point A where the first branch circuit and the second branch circuit are connected is connected to power supply ground via a first capacitor C1 that is configured to provide radio frequency reference ground for an input bias.

The first branch includes two diodes D1 and D2 that connected in series along a forward direction of the first branch current Ib1 and a first resistor R1 that connected between diodes D1 and D2 and the power supply ground. The first branch current Ib1 is inputted to the power supply ground via the first branch circuit.

The second branch circuit includes a second resistor R2 that is connected in parallel with a switch S2. The switch S2 can be implemented with a power device such as an HBT, a MOSFET or an HEMT.

The second branch current Ib2 is inputted to a base of a transistor T1 having a function of current amplification via the second branch circuit. A collector of the transistor T1 is connected to a positive electrode of a DC power supply VBAT. The transistor T1 is configured to amplify the second branch current Ib2 received by the base of the transistor T1, and output the amplified second branch current as a bias current of a power amplifier M1 connected to the bias circuit from an emitter of the transistor T1.

As shown in FIG. 4, the emitter of the transistor is connected to a base of the power amplifier of the power amplification circuit via a third resistor R3.

In the bias circuit provided by the embodiment of the present disclosure, the current Ib provided by a current source is shunted into the first branch current Ib1 and the second branch current Ib2 at the shunt point A. The second branch current Ib2 is amplified to Ib2*β1 by the transistor T1 and then outputted to the base of the power amplifier M1 via the radio frequency resistor RFballast such that a base bias current Ibase=Ib2*β1 provided for the power amplifier M1. In a case where a parameter of the transistor T1, a parameter of the diode D1 and a parameter of the diode D2 are fixed, a ratio of the first branch current Ib1 to the second branch current Ib2 obtained after shunting at the shunt point A is determined based on the resistor R1, the resistor R2, the resistor R3 and the resistor RFballast. As a resistance of the resistor R1 becomes smaller, a resistance of the resistor R2, a resistance of the resistor R3 or a resistance of the resistor RFballast becomes larger, the first branch current Ib1 becomes larger, and the second branch current Ib2 becomes smaller. As the resistance of the resistor R1 becomes larger, the resistance of the resistor R2, the resistance of the resistor R3 or the resistance of the resistor RFballast becomes smaller, the first branch current Ib1 becomes smaller, and the second branch current Ib2 becomes larger.

By switching the switch S2, the resistance value of the resistor R2 may be changed, and the second branch current Ib2 is further changed, so as to control a bias current of the power amplifier M1. Specifically, in a case where the parameter of the resistor R1, the parameter of the resistor R3 and the parameter of the resistor RFballast are fixed, when the switch S2 is switched-on, the resistance value of the second branch circuit is 0, and the second branch current Ib2 reaches a maximum, which can provide the power amplifier in the 2G mode with the bias current; when the switch S2 is switched-off, the resistance value of the second branch circuit is R2, and the second branch current Ib2 reaches a minimum, which can provide the power amplifiers in the 3G and 4G modes with the bias current.

In addition, when the switch S2 is switched-off and switched-on, the shunt point A may have different impedances, such that a radio frequency signal has different impedances at the base in the different modes. In case of broadband modulation signals of 3G and 4G, an impedance of the modulation signal of the bias circuit is low, which is conducive to reducing a memory effect of the circuit.

Identical to the first embodiment, the bias circuit provided in the embodiment of the present disclosure may provide a power amplifier compatible with the different modes, such as the 2G mode, the 3G mode and the 4G mode, with different bias currents, thus improving the performance of the power amplification circuit.

Fourth Embodiment

Figure 5:
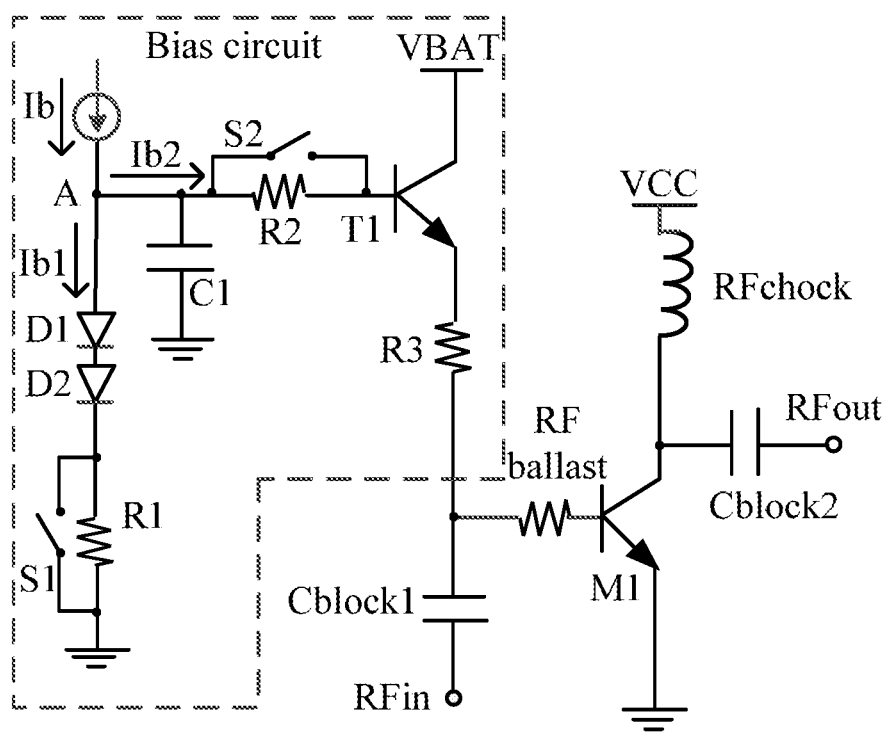
FIG. 5 illustrates a schematic circuit diagram of a power amplification circuit according to a fourth embodiment of the present disclosure.

FIG. 5 is a schematic circuit diagram of a bias circuit according to an embodiment of the present disclosure. As shown in FIG. 5, a first branch circuit and a second branch circuit in the bias circuit provided in the embodiment of the present disclosure are connected at a shunt point A. The first branch circuit and the second branch circuit shunt a current Ib provided by a current source into a first branch current Ib1 and a second branch current Ib2. The shunt point A where the first branch and the second branch are connected is connected to power supply ground via a first capacitor C1 that is configured to provide radio frequency reference ground for an input bias.

The first branch circuit includes two diodes D1 and D2 that connected in series along a forward direction of the first branch current Ib1 and a first resistor R1 that connected between diodes D1 and D2 and the power supply ground. The first branch current Ib1 is inputted to the power supply ground via the first branch circuit. The first resistor R1 is connected in parallel with a first sub-switch S1. The first sub-switch S1 can be implemented with a power device such as an HBT, a MOSFET or an HEMT.

The second branch circuit includes a second resistor R2 that is connected in parallel with a second sub-switch S2. The second sub-switch S2 may be implemented with a power device such as an HBT, a MOSFET or an HEMT.

The second branch current Ib2 is inputted to a base of a transistor T1 having a function of current amplification via the second branch circuit. A collector of the transistor T1 is connected to a positive electrode of a DC power supply VBAT. The transistor T1 is configured to amplify the second branch current Ib2 received by the base of the transistor T1, and then output the amplified second branch current as a bias current of a power amplifier M1 connected to the bias circuit from an emitter of the transistor T1.

As shown in FIG. 5, the emitter of the transistor is connected to a base of the power amplifier of the power amplification circuit via a third resistor R3.

In the bias circuit provided by the embodiment of the present disclosure, the current Ib provided by a current source is shunted into the first branch current Ib1 and the second branch current Ib2 at the shunt point A. The second branch current Ib2 is amplified to Ib2*β1 by the transistor T1 and outputted to the base of the power amplifier M1 via the radio frequency resistor RFballast, which is a base bias current Ibase=Ib2*β1 provided for the power amplifier M1. In a case where a parameter of the transistor T1, a parameter of the diode D1 and a parameter of the diode D2 are fixed, a ratio of the first branch current Ib1 to the second branch current Ib2 obtained after shunting at the shunt point A, is determined based on the resistor R1, the resistor R2, the resistor R3 and the resistor RFballast. As a resistance of the resistor R1 becomes smaller, a resistance of the resistor R2, a resistance of the resistor R3 or a resistance of the resistor RFballast becomes larger, the first branch current Ib1 becomes larger, and the second branch current Ib2 becomes smaller. As the resistance of the resistor R1 becomes larger, the resistance of the resistor R2, the resistance of the resistor R3 or the resistance of the resistor RFballast becomes smaller, the first branch current Ib1 becomes smaller, and the second branch current Ib2 becomes larger.

By switching the first sub-switch S1 and the second sub-switch S2, the resistance of the resistor R1 and the resistance of the resistor R2 may be changed, and the second branch current Ib2 is changed, so as to control the bias current of the power amplifier M1. Specifically, in a case where the parameter of the resistor R1, the parameter of the resistor R2, the parameter of the resistor R3 and the parameter of the resistor RFballast are fixed, when the first sub-switch S1 is opened and the second sub-switch S2 is closed, a resistance of the first branch is R1, a resistance of the second branch is zero, and the second branch current Ib2 reaches a maximum, which can provide the power amplifier in the 2G mode with the bias current; when the first sub-switch S1 is closed and the second sub-switch S2 is opened, the resistance of the first branch is 0, the resistance of the second branch is R2, and the second branch current Ib2 reaches a minimum, which can provide the power amplifiers in the 3G and 4G modes with the bias current.

In addition, when the first sub-switch S1 and the second sub-switch S2 are opened and closed, the shunt point A may have different impedances, such that the radio frequency signal has different impedances at the base in the different modes. In case of broadband modulation signals in the 3G mode and the 4G mode, an impedance of the modulation signal of the bias circuit is low, which is conducive to reducing a memory effect of the circuit.

Identical to the first embodiment, the bias circuit provided in the embodiment of the present disclosure may provide a power amplifier compatible with the different modes such as the 2G mode, the 3G mode and the 4G mode with different bias currents, thus improving the performance of the power amplification circuit.

Fifth Embodiment

A power amplification circuit is provided in the embodiment of the present disclosure. The power amplification circuit includes a power amplifier and a bias circuit.

The bias circuit is connected to the power amplifier and configured to input a bias current to the power amplifier.

The power amplifier is configured to amplify an inputted radio frequency signal correspondingly based on the bias current and output an amplified radio frequency signal.

Here, composition and functions of the bias circuit described in the above technical solution may be adopted in the bias circuit. For example, the bias circuit shown in FIG. 2 may be adopted.

As shown in FIG. 2, a first branch and a second branch in a bias circuit are connected at a shunt point A. Each of the first branch and the second branch shunts a current Ib provided by a current source into a first branch current Ib1 and a second branch current Ib2.

The first branch includes two diodes D1 and D2 connected in series in a forward direction of the first branch current Ib1 and a first resistor R1 connected between a diode D2 and power supply ground. The first branch current Ib1 is inputted to the power supply ground via the first branch. A first resistor R1 is connected in parallel with a switch S1.

The second branch current Ib2 is inputted to a base of a transistor T1 with a function of current amplification via the second branch. A collector of the transistor T1 is connected to a positive electrode of a DC power supply VBAT. The transistor T1 is configured to amplify the second branch current Ib2 received by the base of the transistor T1, and output an amplified second branch current as a bias current of a power amplifier M1 connected to the bias circuit from an emitter of the transistor T1.

A bias circuit of a power amplification circuit provided in the embodiment of the present disclosure includes: a current amplifier, a switch, a first branch and a second branch, where each of the first branch and the second branch is configured to shunt an inputted first current. The current amplifier receives a second branch current of a first current, amplify the second branch current, and output an amplified second branch current as a bias current of a power amplifier connected to the bias circuit. The switch switches different resistances for a resistor in the first branch or the second branch. With the above technical solution, opening and closing of the switch can change the resistance of the resistor in the first branch or the resistance of the resistor in the second branch, thereby changing a radio frequency impedance of the bias circuit with respect to a base of the power amplifier, changing a bias current provided by the bias circuit for the power amplifier, and improving the performance of the power amplification circuit.

The foregoing is only better embodiments of the present disclosure and is not intended to limit the protection scope of the present disclosure.

In the technical solution of the present disclosure, each of a first branch and a second branch of a bias circuit shunts an inputted first current. A current amplifier of the bias circuit receives a second branch current of a first current, amplify the second branch current, and output an amplified second branch current as a bias current of a power amplifier connected to the bias circuit. The switch of the bias circuit switches different resistances for a resistor in each of at least one of the first branch and the second branch. With the above technical solution, opening and closing of the switch can change the resistance of the resistor in the first branch or the resistance of the resistor in the second branch, thereby changing a radio frequency impedance of the bias circuit with respect to a base of the power amplifier, changing a bias current provided by the bias circuit for the power amplifier, and improving the performance of the power amplification circuit.

The invention claimed is:

1. A bias circuit, comprising a first branch circuit, a second branch circuit, a current amplifier and a switch, wherein:
   the first branch circuit is configured to shunt an inputted first current and input a first branch current of the first current to power supply ground;
   the second branch circuit is configured to shunt the inputted first current and input a second branch current of the first current to the current amplifier;
   the current amplifier is configured to receive the second branch current, amplify the second branch current, and output the amplified second branch current as a bias current of a power amplifier connected to the bias circuit;
   the switch is configured to switch different resistance values for a first resistor in the first branch circuit, and/or switch different resistance values for a second resistor in the second branch circuit;
   the current amplifier comprises a transistor, a collector of the transistor is connected to a positive electrode of a direct current (DC) power supply, the transistor is configured to amplify the received second branch current and output the amplified second branch current as the bias current of the power amplifier connected to the bias circuit;
   an emitter of the transistor is connected to a base of the power amplifier, which is part of a power amplification circuit, via a third resistor; and
   the first branch circuit comprises at least one diode connected in series along a forward direction of the first branch current.

2. The bias circuit according to claim 1, wherein the first branch circuit comprises the first resistor;
   the switch is connected in parallel with the first resistor, or the second branch circuit comprises the second resistor, and the switch is connected in parallel with the second resistor.

3. The bias circuit according to claim 1, wherein the first branch circuit comprises the first resistor, and the second branch circuit comprises the second resistor.

4. The bias circuit according to claim 1, wherein the switch is a Heterojunction Bipolar Transistor (HBT), a Metal Oxide Semiconductor Field Effect Transistor (MOSFET), or a High Electron Mobility Transistor (HEMT).

5. The bias circuit according to claim 1, wherein a shunt point where the first branch circuit is connected to the second branch circuit is connected to the power supply ground via a first capacitor.

6. The bias circuit according to claim 1, wherein the at least one diode is connected between the first resistor and the power supply ground, or the first resistor is connected between the at least one diode and the power supply ground.

7. A power amplification circuit, comprising:
   a power amplifier, and
   a bias circuit comprising:
   a first branch circuit;
   a second branch circuit;
   a current amplifier; and
   a switch;
   wherein:
   the first branch circuit is configured to shunt an inputted first current and input a first branch current of the first current to power supply ground;
   the second branch circuit is configured to shunt the inputted first current and input a second branch current of the first current to the current amplifier;
   the current amplifier is configured to receive the second branch current, amplify the second branch current, and output the amplified second branch current as a bias current of the power amplifier connected to the bias circuit;
   the switch is configured to switch different resistance values for a first resistor in the first branch circuit, and/or switch different resistance values for a second resistor in the second branch circuit;
   the current amplifier comprises a transistor, a collector of the transistor is connected to a positive electrode of a direct current (DC) power supply, the transistor is configured to amplify the received second branch current and output the amplified second branch current as the bias current of the power amplifier connected to the bias circuit;
   an emitter of the transistor is connected to a base of the power amplifier via a third resistor;
   the first branch circuit comprises at least one diode connected in series along a forward direction of the first branch current;
   the at least one diode is connected between the first resistor and the power supply ground, or the first resistor is connected between the at least one diode and the power supply ground;
   the bias circuit is connected to the power amplifier and configured to input the bias current to the power amplifier; and
   the power amplifier is configured to amplify, based on the bias current, an inputted radio frequency signal correspondingly and output the amplified radio frequency signal.

8. A communication system comprising a power amplification circuit comprising:
   a power amplifier, and
   a bias circuit comprising:
   a first branch circuit;
   a second branch circuit;

a current amplifier; and a switch;

wherein:

the first branch circuit is configured to shunt an inputted first current and input a first branch current of the first current to power supply ground;

the second branch circuit is configured to shunt the inputted first current and input a second branch current of the first current to the current amplifier;

the current amplifier is configured to receive the second branch current, amplify the second branch current, and output the amplified second branch current as a bias current of the power amplifier connected to the bias circuit;

the switch is configured to switch different resistance values for a first resistor in the first branch circuit, and/or switch different resistance values for a second resistor in the second branch circuit;

the current amplifier comprises a transistor, a collector of the transistor is connected to a positive electrode of a direct current (DC) power supply, the transistor is configured to amplify the received second branch current and output the amplified second branch current as the bias current of the power amplifier connected to the bias circuit;

an emitter of the transistor is connected to a base of the power amplifier via a third resistor;

the first branch circuit comprises at least one diode connected in series along a forward direction of the first branch current;

the at least one diode is connected between the first resistor and the power supply ground, or the first resistor is connected between the at least one diode and the power supply ground;

the bias circuit is connected to the power amplifier and configured to input the bias current to the power amplifier;

the power amplifier is configured to amplify, based on the bias current, an inputted radio frequency signal correspondingly and output the amplified radio frequency signal; and the switch is configured for switching-on and switching-off operations to change among the different resistance values of the first resistor in the first branch circuit or among the different resistance values of the second resistor in the second branch circuit, thereby changing a radio frequency impedance of the bias circuit with respect to the base of the power amplifier, changing the bias current provided by the bias circuit to the power amplifier, and improving a performance of the power amplification circuit.

\* \* \* \* \*